United States Patent
Seo et al.

(10) Patent No.: US 9,905,987 B2
(45) Date of Patent: Feb. 27, 2018

(54) LASER RADAR SYSTEM

(71) Applicant: ELECTRONICS AND TELECOMMUNICATIONS RESEARCH INSTITUTE, Daejeon (KR)

(72) Inventors: Hong-Seok Seo, Daejeon (KR); Bong Ki Mheen, Daejeon (KR); Min Hyup Song, Daejeon (KR); Gyu Dong Choi, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 15/237,627

(22) Filed: Aug. 15, 2016

(65) Prior Publication Data
US 2017/0264069 A1 Sep. 14, 2017

(30) Foreign Application Priority Data

Mar. 10, 2016 (KR) .......... 10-2016-0028886

(51) Int. Cl.
*H01S 3/067* (2006.01)
*H01S 3/10* (2006.01)
*G02B 26/10* (2006.01)
*H01S 5/024* (2006.01)
*H01S 3/0941* (2006.01)

(52) U.S. Cl.
CPC ........ *H01S 3/06783* (2013.01); *G02B 26/101* (2013.01); *H01S 3/0941* (2013.01); *H01S 3/10084* (2013.01); *H01S 5/02415* (2013.01)

(58) Field of Classification Search
CPC ............ H01S 3/06754; H01S 3/06758; H01S 3/06783; G02B 26/101
See application file for complete search history.

(56) References Cited

U.S. PATENT DOCUMENTS

| | | | | |
|---|---|---|---|---|
| 5,321,707 A * | 6/1994 | Huber | ............... | H01S 3/094003 372/6 |
| 5,835,199 A * | 11/1998 | Phillips | ................. | G01S 7/4802 356/28.5 |
| 5,903,385 A * | 5/1999 | Sugaya | ................ | H04B 10/077 359/337 |
| 6,084,233 A * | 7/2000 | Hodgson | ............ | G01D 5/35383 250/227.14 |

(Continued)

FOREIGN PATENT DOCUMENTS

KR 10-2015-0125296 A 11/2015

*Primary Examiner* — Eric L Bolda
(74) *Attorney, Agent, or Firm* — Rabin & Berdo, P.C.

(57) ABSTRACT

A laser radar system includes a first light source unit including a signal light source—a seed laser diode or a light source for amplifying a laser beam from the seed laser diode—and a pump laser diode, a second light source unit disposed to be spaced apart from the first light source unit, the second light source unit including an optical amplifier for amplifying a signal output from the first light source unit, and an optical connector for connecting the first light source unit and the second light source unit to each other, wherein the second light source unit is disposed at an end of a laser transceiver unit of the laser radar system.

3 Claims, 4 Drawing Sheets

(56) References Cited

U.S. PATENT DOCUMENTS

| | | | |
|---|---|---|---|
| 6,580,497 B1* | 6/2003 | Asaka | G01S 7/481 |
| | | | 356/28.5 |
| 7,649,616 B2 | 1/2010 | Michael et al. | |
| 8,946,637 B2 | 2/2015 | Chinn et al. | |
| 2005/0002013 A1* | 1/2005 | Harris | G01P 5/26 |
| | | | 356/4.1 |
| 2009/0316134 A1* | 12/2009 | Michael | G01C 3/08 |
| | | | 356/4.01 |
| 2013/0341486 A1 | 12/2013 | Oh et al. | |
| 2014/0240691 A1 | 8/2014 | Mheen et al. | |
| 2015/0138531 A1* | 5/2015 | Lee | G01K 11/32 |
| | | | 356/32 |

\* cited by examiner

LASER RADAR SYSTEM

CROSS-REFERENCE TO RELATED APPLICATION

The present application claims priority to Korean patent application number 10-2016-0028886 filed on Mar. 10, 2016, the entire disclosure of which is incorporated herein in its entirety by reference.

BACKGROUND

1. Field

An aspect of the present disclosure relates to a laser radar system for obtaining accurate three-dimensional images and videos from distances and speeds, which are acquired through a pulse laser light source.

2. Description of the Related Art

In general, a laser radar system is a video sensor apparatus for acquiring three-dimensional videos, and is used in various fields. For example, the laser radar system is coupled to an unmanned autonomous robot, a military robot, a vehicle, or the like, to identify a change state of a structure, to identify whether a landslide has occurred, etc. Particularly, a laser radar light source not using a method for creating videos from external light but using a method for measuring light irradiated therefrom and then returned thereto is available regardless of peripheral environments, and outputs high-quality videos. Thus, the laser radar light source is used in various fields.

Typically, a pulse light source and a continuous wave (CW) light source were used as laser light sources of laser radars. The pulse light source has a high accuracy and is advantageous in long-distance measurement, as compared with the CW light source. Hence, the pulse light source is increasingly used. Accordingly, there are introduced methods for acquiring three-dimensional videos through various implementation techniques using the pulse light source.

However, as the output of pulse light source increases, a large amount of heat is generated from the pulse light source. The heat causes the output of a laser to decrease, and the laser may be broken due to overheat.

SUMMARY

Embodiments provide a laser radar system in which heat generated from a driving unit of a laser diode and heat generated from an amplifier for laser beams are separated from each other, thereby efficiently managing a heat-generation state of the laser radar system.

Embodiments also provide a laser radar system in which a first light source unit is mounted in a light source driving unit, and a second light source unit is mounted at an end of laser transmitting unit, so that it is possible to minimize the size of the second light source unit and to shorten the length of an optical fiber for connecting an output port of the second light source unit to the laser transmitting unit.

According to an aspect of the present disclosure, there is provided a laser radar system including: a first light source unit including a signal light source and a pump laser diode; a second light source unit disposed to be spaced apart from the first light source unit, the second light source unit including an optical amplifier for amplifying a signal output from the first light source unit; and an optical connector for connecting the first light source unit and the second light source unit to each other, wherein the second light source unit is disposed at an end of a laser transceiver unit of the laser radar system.

According to another aspect of the present disclosure, there is provided a laser radar system including: a main control system including a laser driving unit and a first light source unit controlled by the laser driving unit; and an optical front end disposed to be spaced apart from the main control system, the optical front end including a second light source unit and a laser transceiver unit, wherein the first light source unit includes a signal light source and a pump laser diode, the second light source unit includes an optical amplifier for amplifying a signal output from the first light source unit, and is provided at an end of the laser transceiver unit, and the first light source unit and the second light source unit are connected to each other through an optical connector.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
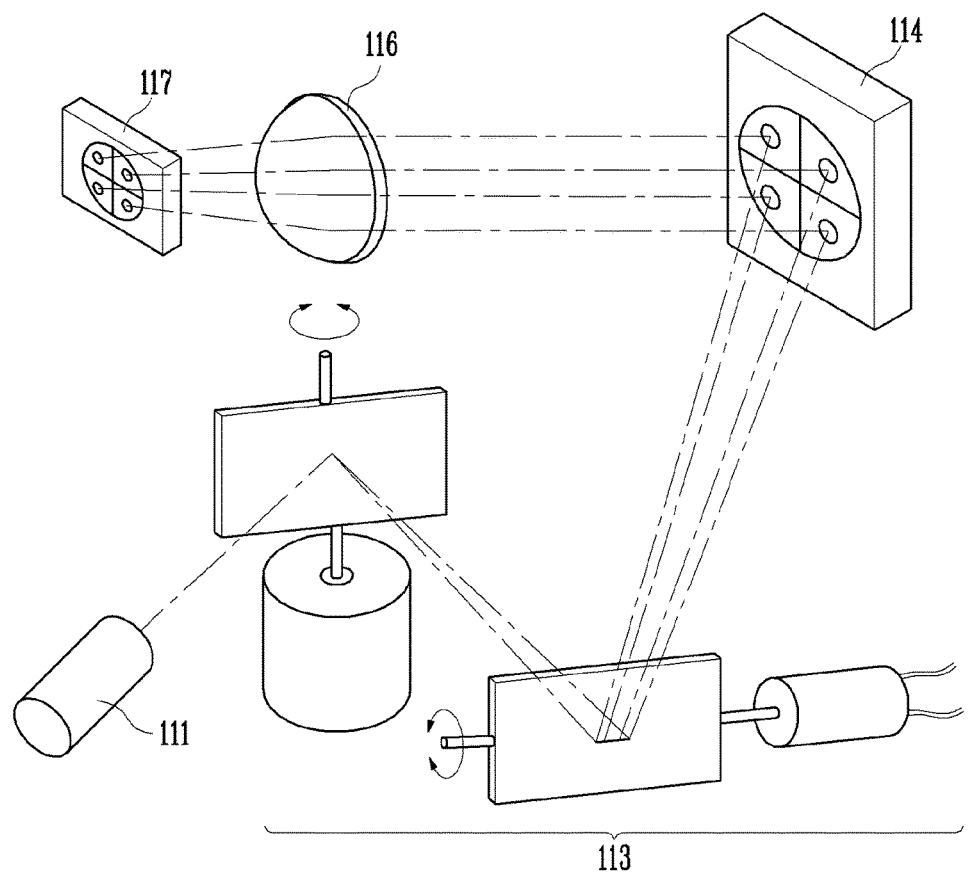
FIG. 1 is a diagram illustrating a configuration of a laser transceiver unit of a laser radar system according to the present disclosure.

In the detailed descriptions of the exemplary embodiments of present disclosure, reference will be made to the accompanying drawings illustrating specific embodiments of the present disclosure. The embodiments are described in detail so that those of ordinary skill in the art may carry out the present disclosure. It will be understood that the various embodiments of the present disclosure are different from each other, but are not necessarily mutually exclusive. For example, the specific shapes, structures, and characteristics described herein may be modified from one embodiment to another embodiment without departing from the spirit and scope of the present disclosure. Furthermore, it will be understood that positions or arrangements of individual elements in each embodiment may be modified without departing from the spirit and scope of the present disclosure. Therefore, the following detailed description should not be construed as being limitative. Thus, the scope of the present disclosure should be construed to cover the claims and equivalents thereof. Like reference numerals refer to like elements.

Hereinafter, embodiments of the present disclosure will be described in detail with reference to the accompanying drawings so that those of ordinary skill in the art may easily implement the present disclosure.

FIG. 1 is a diagram illustrating a configuration of a laser transceiver unit of a laser radar system according to the present disclosure.

Referring to FIG. 1, the laser transceiver unit of the laser radar system according to the present disclosure may include a pulse laser generator 111, an optical deflector 113, a target 114, a light receiving lens 116, and an optical detector 117.

A laser beam output from the pulse laser generator 111 is output to the optical deflector 113. The output laser beam may be irradiated onto desired areas, i.e., different areas with respect to the target 114 through the optical deflector 113 over time. The laser beam irradiated onto a specific area is reflected from the target 114, and the reflected laser beam may be condensed through the light receiving lens 116 to be input to the optical detector 117. The size and distance of the target 114 can be detected from the laser beams acquired from the optical detector 117.

In FIG. 1, the laser radar system performs scanning in a one-dimensional form (linear form) on a plane so as to illustrate the form of scanning, but it should be understood that the laser radar system actually performs scanning on the front on a two-dimensional plane. In this case, a scanned pattern may be variously applied to not only two-dimensional plane coordinates having the same distance but also circular coordinates or other coordinates having different distances. Such a pattern can be implemented as an appropriated driving signal is applied to an optical scanner, and the implemented pattern can determine the quality of a three-dimensional video.

Next, components such as a collimator may be further included between the pulse laser generator 111 and the optical deflector 113, and an optical filter, etc. may be further included between the target 114 and the light receiving lens 116.

In addition, a method for irradiating a laser beam at different positions with respect to the target 114 over time may be variously changed or may be applied through a design change. For example, the optical deflector 113 may use a galvano mirror driven by a motor to sequentially irradiate a laser pulse at a plurality of positions with respect to the target 114 over time. Alternatively, the optical deflector 113 may use a polygonal rotating mirror driven by a motor to control the path of beams. Alternatively, the optical deflector 113 may be implemented by an electro-optic scanner. The electro-optic scanner is a kind of optical waveguide for controlling the direction of an incident beam in response to an electrical signal applied to an electrode. Alternatively, the optical deflector 113 may be implemented by a fiber array laser. The fiber array laser may be implemented by arrayed waveguide grating (AWG). The fiber array laser allows an incident laser beam to be optically delayed using the AWG or to have another wavelength, thereby irradiating the laser beam onto a target through a plurality of fiber tips facing in different directions. Accordingly, optical scanning can be performed at different wavelengths or different times. The optical deflector 113 implemented by the electro-optic scanner or the fiber array laser has no physical driver. Thus, the optical deflector 113 is resistant to shock and causes little vibration and noise.

Next, the optical deflector 113 may be implemented using at least one of a stepping motor, a brushless DC (BLDC) motor, a rotating mirror, an electromagnet-type galvano mirror, an acousto-optic deflector, a two-axis driving scan mirror, an MEMS scanner, and MEMS reflectors. Alternatively, the optical reflector 113 for two-dimensional scanning may be implemented through a combination of homogeneous or heterogeneous scanners. A light transmitting unit provided between the pulse laser connector 111 and the optical deflector 113 may include a collimator, a beam expander, a lens, and the like, or may include one or two combinations thereof.

Figure 2:
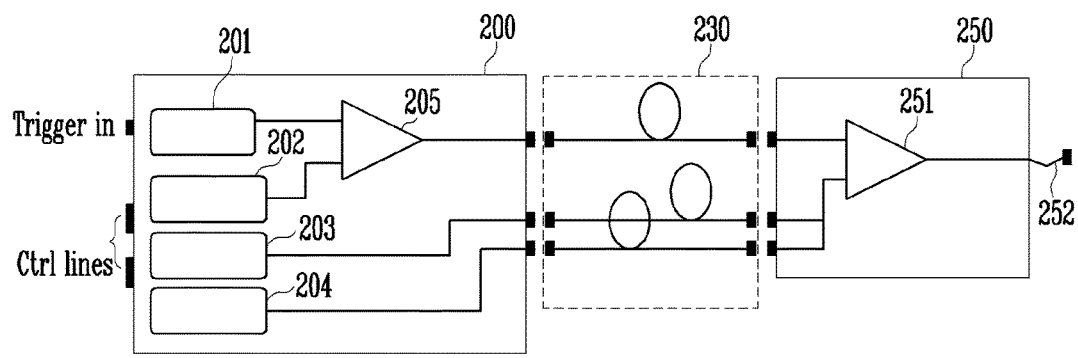
FIG. 2 is a diagram illustrating in detail internal configurations of a first light source unit and a second light source unit in a light source separation type laser radar system according to an embodiment of the present disclosure.

FIG. 2 is a diagram illustrating in detail internal configurations of a first light source unit and a second light source unit in a light source separation type laser radar system according to an embodiment of the present disclosure.

Referring to FIG. 2, a light source of the laser radar system according to the embodiment of the present disclosure may be separated into a first light source unit 200 and a second light source unit 250.

The first light source unit 200 is mounted inside a light source driving unit (not shown) of the laser radar system or at one side of the light source driving unit, to be supplied with trigger signals and power, which are output from the light source driving unit. In FIG. 2, 'Trigger in' and 'Ctrl lines' represent that trigger signals and other control signals are input to the first light source unit 200 through a predetermined input port.

The second light source unit 250 is provided to be physically spaced apart from the first light source unit 200. More specifically, the second light source unit 250 is mounted at one end of a laser transmitting unit in the laser transceiver unit of the laser radar system, to output a final laser beam to the laser transmitting unit. Particularly, unlike the first light source unit 200, a separate electronic controller and a separate power supply unit may not be connected to the second light source unit 250. That is, the second light source unit 250 may include only a predetermined optical amplifier.

An optical connector 230 for connecting the first and second light source units 200 and 250 to each other may be provided between the first and second light source units 200 and 250. The optical connector 230 may be an optical fiber, and may include a connector for connecting a signal light source and a connector for connecting a pump light source. In this case, the connector for connecting the signal light source or the connector for connecting the pump light source may be provided in one or more.

Hereinafter, internal configurations of the first and second light source units 200 and 250 will be described in detail.

First, the first light source unit 250 may include a seed laser diode 201, a pump laser diodes 202 to 204.

The seed laser diode 201 of the first light source unit 200 may be operated by a trigger signal input to the first light source unit 200. An internal temperature of the seed laser diode 201 may be monitored by a controller. The internal temperature of the seed laser diode 201 can be constantly maintained through control of a predetermined thermal electric cooler (TEC) (not shown).

The pump laser diodes 202 to 204 may be core pump laser diodes or cladding pump laser diodes. Like the seed laser diode 201, internal or surface temperatures of the pump laser diodes 202 to 204 may be monitored by the controller.

Output powers of the seed laser diode 201 and the pump laser diodes 202 to 204 may be controlled by a laser driver (not shown). The seed laser diode 201 or the pump laser diodes 202 to 204 may be provided in one or more. Meanwhile, the first light source unit 200 may further include an optical amplifier 205. Particularly, when the intensity of peak output of the seed laser diode 201 is low, the optical amplifier 205 may be further provided so as to increase the peak power.

The optical amplifier 205 provided in the first light source unit 200 may have a core pump structure or a cladding pump structure. Meanwhile, a plurality of optical amplifiers may be consecutively connected depending on an output value of the optical amplifier 205. However, the optical amplifiers may be provided such that the intensity of a peak output of a signal beam amplified in the first light source is limited to 1 kW or less.

The optical amplifier 205 may combine output signals of the seed laser diode 201 and the pump laser diode 202 using wavelength division multiplexing (WDM) and amplify the combined output signal through an optical fiber amplifier. Hereinafter, the combined output signal is referred to as a signal light source.

To this end, the seed laser diode 201 may be equipped with an optical isolator, and a narrow bandpass filter may be further provided at a front end of the optical isolator.

The first light source unit 200 may be provided with an output port for outputting a signal light source (or amplified signal light source) output by a combination of the seed laser diode 201 and the pump laser diode 202. Also, the first light source unit 200 may be provided with an output port for outputting a pump light source output from the pump laser diodes 203 and 204.

The first light source unit 200 may have a structure in which a plurality of signal light sources are output. That is, the first light source unit 200 may have a structure in which a signal light source output from the seed laser diode 201 or an amplified signal light source is divided to be output to a plurality of ports. The first light source unit 200 may also be provided with a plurality of signal light ports for outputting a signal light source and a plurality of pump light output ports for outputting a pump light source.

The pump light source may be used to pump an optical amplifier 251 in the second light source unit 250, which will be described later. The pump light source may be a high-output semiconductor laser diode. It will be apparent that the high-output semiconductor laser diodes may be connected in plurality.

Each of the signal light sources and the pump light sources may be output to the second light source unit 250 through an output port.

Next, the second light source unit 250 may include the optical amplifier 251. More specifically, unlike the first light source unit 200, the second light source unit 250 does not include a predetermined laser diode, and hence a separate electronic controller and a separate power supply unit are not connected to the second light source unit 250. Therefore, the second light source unit 250 is also not provided with electric wires for transmitting electrical signals. That is, all electronic driving units of the laser radar system according to the present disclosure, the seed laser diode 201, and the pump laser diodes 202 to 204 may be included in the first light source unit 200, and only the final optical amplifier 251 may be included in the second light source unit 250.

The second light source unit 250 may receive a signal light source and a pump light source, transmitted from the first light source unit 200 through the optical connector 230, and the signal light source may be amplified by the optical amplifier 251 through the pump light source. In this case, the optical amplifier 251 may be configured in plurality, i.e., in multi-stages.

The optical amplifier 251 provided in the second light source unit 250 may combine a signal light source and a pump light source using the WDM or a signal-pump combiner, and amplify the combined light source through an optical fiber. In this case, an optical isolator may be further provided to a signal light source line before/after the amplification.

An output port 252 of the second light source unit 250 is not connected to a separate connector but may be connected directly to the laser transmitting unit of the laser radar system.

At this time, in order to prevent signal distortion caused by nonlinearity, the length of an optical fiber used as the output port 252 of the second light source unit 250 may be formed short to be 1 m or less.

According to the present disclosure, since the second light source unit 250 is configured with only the optical amplifier 251, the second light source unit 250 can be driven without electro-magnetic interference (EMI). Further, since the second light source unit 250 is configured to be compact (no separate component except the optical amplifier), the second light source unit 250 can be mounted as adjacent as possible to the laser transceiver unit of the laser radar system.

In the case of a typical integrated laser radar light source, the size of the light source is large, and the lights source is provided with a large number of control lines and power lines. Therefore, there is a limitation in supplying a light output as the light source is adjacent to a laser transmitting unit of a laser radar system. On the other hand, according to the present disclosure, the light source of the laser radar system is separated into the first light source unit 200 and the second light source unit 250, so that it is possible to further minimized the size of the laser transceiver unit of the laser radar system. Particularly, elements generating a large amount of heat are separately included in the first light source unit 200 to be managed, so that it is possible to prevent a power degradation of the light source due to heat.

Figure 3:
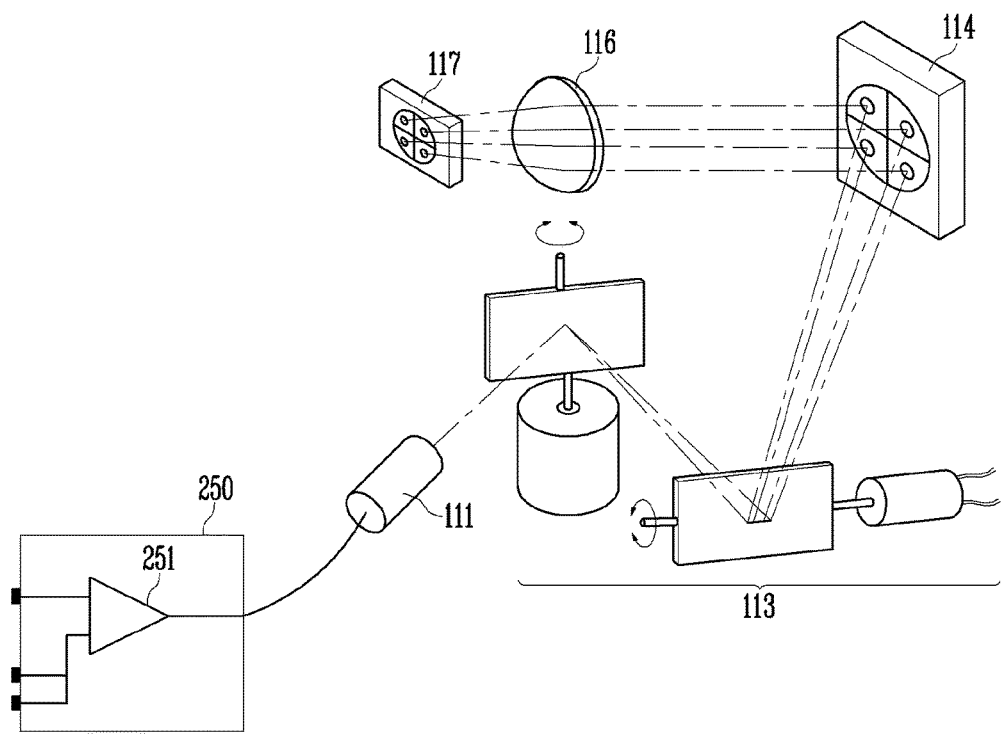
FIG. 3 is a diagram exemplarily illustrating that the laser transceiver unit is connected to the second light source unit of the laser radar system according to the embodiment of the present disclosure.

FIG. 3 is a diagram exemplarily illustrating that the laser transceiver unit is connected to the second light source unit of the laser radar system according to the embodiment of the present disclosure.

As shown in FIG. 3, the optical fiber as the output port 252 of the second light source unit 250 may be connected directly to the laser transmitting unit, i.e., the pulse laser generator 111, in the laser transceiver unit of the laser radar system without any separate connector.

The optical fiber as the output port 252 of the second light source unit 250 may be provided with an end cap such that an end of the optical fiber is not damaged by high-output laser beams. Although only one output port 252 of the second light source unit 250 is illustrated in FIGS. 2 and 3, the present disclosure is not limited thereto, and the output port 252 of the second light source unit 250 may be provided in plurality.

Figure 4:
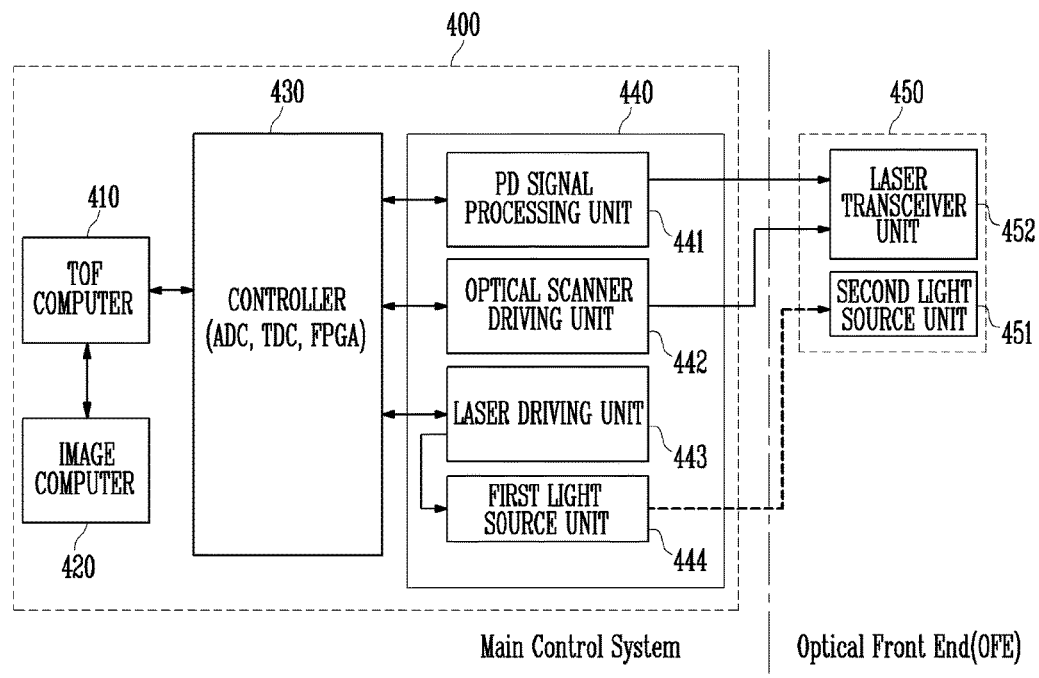
FIG. 4 is a diagram schematically illustrating the entire configuration of the laser radar system according to the present disclosure.

FIG. 4 is a diagram schematically illustrating the entire configuration of the laser radar system according to the present disclosure.

First, referring to FIG. 4, the entire laser radar system may be divided into a main control system 400 and an optical front end (OFE) 450. The main control system 400 may include a time of flight (TOF) computer 410, an image computer 420, a controller 430, and a light source driving unit 440 including a first light source unit 444. The OFE 450 may include a second light source unit 451 and a laser transceiver unit 452. Configurations and functions of the second light source unit 451 and the laser transceiver unit 452, which are included in the OFE 450, have been described in detail with reference to FIGS. 1 to 3, and therefore, their descriptions will be omitted.

Meanwhile, for convenience of description, reference numerals of the first light source unit 200 and the second light source unit 250, shown in FIGS. 2 and 3, are different from those of the first light source unit 444 and the second light source unit 451, shown in FIG. 4, but the first and second light source units in each figure may be identical to each other.

The TOF computer 410 may function to compute information such as a distance to a target with reference to data acquired from the controller 430.

The image computer 420 may function to create a stereoscopic video for the data transmitted from the TOF computer 430.

The controller 430 may function to control the flow of data between the TOF computer 410 and the light source driving unit 440. To this end, the controller 430 may include an analog to digital converter (ADC), a time to digital converter (TCD), and a field programmable gate array (FPGA).

The light source driving unit 440 may include a PD signal processing unit 441, an optical scanner driving unit 442, a laser driving unit 443, and the first light source unit 444. The PD signal processing unit 441 may function to process a signal acquired from the laser transceiver unit 452, and the optical scanner driving unit 442 may function to control the deflection of a laser beam. The laser driving unit 443 may function to control the output of a laser diode and supply a trigger signal to the first light source unit 444. The configuration and functions of the first light source unit 444 have been described above, and therefore, their descriptions will be omitted.

Referring to FIG. 4, the first light source unit 444 and the second light source unit 451 can be connected to each other through an optical connector (e.g., an optical fiber) without any separate electrical connector.

Figure 5:
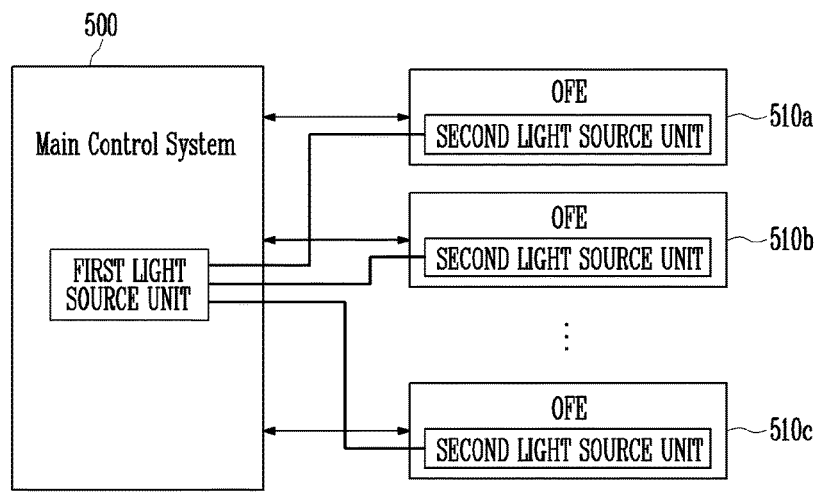
FIG. 5 is a diagram schematically illustrating the entire configuration of a laser radar system according to another embodiment of the present disclosure.

FIG. 5 is a diagram schematically illustrating the entire configuration of a laser radar system according to another embodiment of the present disclosure.

Referring to FIG. 5, the entire laser radar system according to the embodiment of the present disclosure may include one main control system 500 and a plurality of OFEs 510a, 510b, and 510c. Meanwhile, the main control system 500 and each of the plurality of OFEs 510a, 510b, and 510c may have the same configurations as the main control system 400 and the OFE 450.

Since the laser radar system has a structure in which the one main control system 500 operates the plurality of OFEs 510a, 510b, and 510c, the main control system 500 may include one first light source unit, and each of the plurality of OFEs 510a, 510b, and 510c may also include one second light source unit. That is, a plurality of second light source units may be connected to the one first light source unit.

In this case, the first light source unit may include a plurality of optical amplifiers and optical devices which may divide signal light into a plurality of output ports. The plurality of second light source units may be connected to the respective signal light output ports of the first light source through an optical connector.

Figure 6:
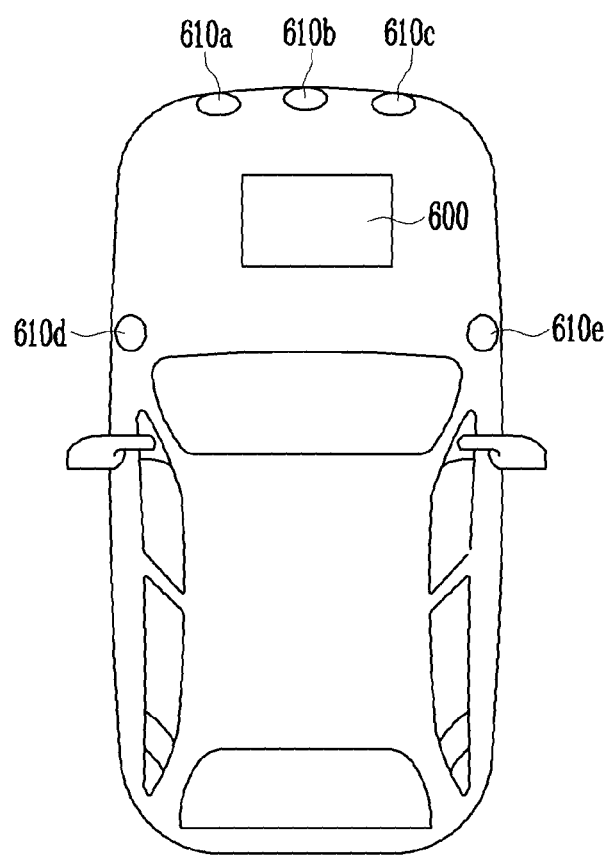
FIG. 6 is a diagram exemplarily illustrating a vehicle laser radar system to which the laser radar system according to the present disclosure is applied.

FIG. 6 is a diagram exemplarily illustrating a vehicle laser radar system to which the laser radar system according to the present disclosure is applied.

Referring to FIG. 6, a main control system 600 of the laser radar system is provided inside a vehicle, and may be connected to a predetermined system inside the vehicle to automatically control the vehicle. Meanwhile, for convenience of description, reference numerals of the main control system 500 and the OFEs 510a to 510c, shown in FIG. 5, are different from those of the main control system 600 and OFEs 610a to 610e, shown in FIG. 6, but they have the same configurations. As described in FIG. 5, a plurality of OFEs 610a to 610e may be connected to the main control system 600. More specifically, the OFEs 610a and 610e may be respectively provided at both sides of the vehicle, and a plurality of OFEs may be provided at a front corresponding to the direction in which the vehicle advances.

Each of the OFEs 610a to 610e irradiates a pulsed laser beam and acquires a received beam corresponding to the laser beam. Then, each of the OFEs 610a to 610e provides the acquired beam to the main control system 600. The main control system 600 processes data transmitted from the respective OFEs 610a to 610e, so that it is possible to acquire, in real time, information on peripheral situations of the vehicle, e.g., road situations, distances from pedestrians, etc.

Meanwhile, although it is illustrated in FIG. 6 that five OFEs 610a to 610e are provided, the present disclosure is not limited thereto, and the number of the OFEs 610a to 610e may be arbitrarily changed.

According to the present disclosure, as the first light source unit and the second light source unit including only the optical amplifier are separated from each other, heat generated from the driving unit of the laser diode and heat generated from the amplifier for laser beams are separated from each other, thereby efficiently managing a heat-generation state of the laser radar system.

Also, according to the present disclosure, as the second light source unit is connected to an end of the laser transmitting unit of the laser radar system, the distance between the second light source unit and the laser transmitting unit can be shortened. Thus, the nonlinearity of the optical fiber is reduced, so that high-output pulses can be transmitted to the laser transmitting unit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A laser radar system comprising:
a first light source unit including a seed laser diode, a first pump laser diode, a second pump laser diode, and a first optical amplifier connected with the seed laser diode and the first pump laser diode;
a second light source unit disposed separately from the first light source unit, the second light source unit including a second optical amplifier configured to amplify a signal output from the first light source unit, and a transmitter and a receiver separated from each other, wherein:

the second optical amplifier is connected to the first optical amplifier and the second pump laser diode through an optical fiber, and the second light source unit is disposed at an end of the transmitter.

2. The laser radar system of claim 1, wherein the transmitter includes a pulse laser generator and an optical deflector, and the second light source unit is coupled to the pulse laser generator disposed at an end of the transmitter.

3. The laser radar system of claim 1, wherein the receiver comprises a light receiving lens and an optical detector.

* * * * *